US008574976B2

(12) United States Patent
Yamazaki et al.

(10) Patent No.: US 8,574,976 B2
(45) Date of Patent: *Nov. 5, 2013

(54) SEMICONDUCTOR DEVICE AND MANUFACTURING METHOD THEREOF

(75) Inventors: Shunpei Yamazaki, Tokyo (JP); Naoto Kusumoto, Kanagawa (JP); Hideto Ohnuma, Kanagawa (JP); Koichiro Tanaka, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 333 days.

This patent is subject to a terminal disclaimer.

(21) Appl. No.: 12/904,235

(22) Filed: Oct. 14, 2010

(65) Prior Publication Data
US 2011/0033988 A1 Feb. 10, 2011

Related U.S. Application Data

(60) Division of application No. 12/041,014, filed on Mar. 3, 2008, now Pat. No. 7,816,195, which is a division of application No. 09/451,665, filed on Nov. 30, 1999, now Pat. No. 7,348,227, which is a continuation of application No. 08/908,281, filed on Aug. 7, 1997, now Pat. No. 6,353,244, which is a continuation of application No. 08/620,462, filed on Mar. 22, 1996, now abandoned.

(30) Foreign Application Priority Data

Mar. 23, 1995 (JP) ...................................... 7-090157

(51) Int. Cl.
*H01L 21/00* (2006.01)

(52) U.S. Cl.
USPC .......................... 438/217; 438/276; 438/289

(58) Field of Classification Search
USPC .................................. 438/166, 276, 217, 289
See application file for complete search history.

(56) References Cited

U.S. PATENT DOCUMENTS

| 3,814,992 A | | 6/1974 | Kump et al. | |
| 3,891,468 A | | 6/1975 | Ito et al. | |
| 4,472,871 A | * | 9/1984 | Green et al. | 438/276 |
| 5,045,898 A | * | 9/1991 | Chen et al. | 257/305 |
| 5,111,266 A | * | 5/1992 | Furumura et al. | 257/198 |
| 5,270,224 A | * | 12/1993 | Furumura et al. | 438/320 |

(Continued)

FOREIGN PATENT DOCUMENTS

| EP | 0690510 A | 1/1996 |
| JP | 57-102067 A | 6/1982 |

(Continued)

OTHER PUBLICATIONS

Office Action (U.S. Appl. No. 08/433,561) Dated Jun. 21, 2004.

*Primary Examiner* — Laura Menz
(74) *Attorney, Agent, or Firm* — Fish & Richardson P.C.

(57) ABSTRACT

A TFT having a high threshold voltage is connected to the source electrode of each TFT that constitutes a CMOS circuit. In another aspect, pixel thin-film transistors are constructed such that a thin-film transistor more distant from a gate line drive circuit has a lower threshold voltage. In a further aspect, a control film that is removable in a later step is formed on the surface of the channel forming region of a TFT, and doping is performed from above the control film.

18 Claims, 8 Drawing Sheets

(56) References Cited

U.S. PATENT DOCUMENTS

| | | | | |
|---|---|---|---|---|
| 5,292,675 | A | * | 3/1994 | Codama .................. 438/163 |
| 5,396,084 | A | * | 3/1995 | Matsumoto ................ 257/72 |
| 5,403,762 | A | * | 4/1995 | Takemura ................. 438/164 |
| 5,485,019 | A | * | 1/1996 | Yamazaki et al. ............ 257/57 |
| 5,488,000 | A | * | 1/1996 | Zhang et al. ............... 438/166 |
| 5,518,937 | A | * | 5/1996 | Furumura et al. ........... 438/309 |
| 5,581,092 | A | * | 12/1996 | Takemura ................. 257/65 |
| 5,594,264 | A | * | 1/1997 | Shirahata et al. ............ 257/335 |
| 5,594,371 | A | | 1/1997 | Douseki |
| 5,672,541 | A | * | 9/1997 | Booske et al. .............. 438/513 |
| 5,889,315 | A | * | 3/1999 | Farrenkopf et al. .......... 257/552 |
| 5,910,672 | A | * | 6/1999 | Iwamatsu et al. ........... 257/347 |
| 5,914,498 | A | * | 6/1999 | Suzawa et al. .............. 257/66 |
| 5,936,287 | A | | 8/1999 | Gardner et al. |
| 5,950,085 | A | * | 9/1999 | Kojima et al. .............. 438/257 |
| 5,981,974 | A | * | 11/1999 | Makita ................... 257/72 |
| 6,011,277 | A | | 1/2000 | Yamazaki |
| 6,013,930 | A | * | 1/2000 | Yamazaki et al. ........... 257/353 |
| 6,027,978 | A | * | 2/2000 | Gardner et al. ............. 438/289 |
| 6,121,660 | A | * | 9/2000 | Yamazaki et al. ........... 257/348 |
| 6,165,876 | A | * | 12/2000 | Yamazaki et al. ........... 438/517 |
| 6,171,889 | B1 | * | 1/2001 | Iwamatsu et al. ........... 438/162 |
| 6,204,535 | B1 | * | 3/2001 | Yamazaki et al. ........... 257/353 |
| 6,218,219 | B1 | * | 4/2001 | Yamazaki et al. ........... 438/149 |
| 6,222,235 | B1 | | 4/2001 | Kojima et al. |
| 6,235,563 | B1 | * | 5/2001 | Oka et al. ................. 438/166 |
| 6,246,070 | B1 | * | 6/2001 | Yamazaki et al. ........... 257/40 |
| 6,423,601 | B1 | * | 7/2002 | Ishida et al. ............... 438/306 |
| 6,624,476 | B1 | | 9/2003 | Chan et al. |
| 6,747,319 | B2 | | 6/2004 | Kojima et al. |
| 6,872,640 | B1 | * | 3/2005 | Mouli ..................... 438/514 |
| 6,878,968 | B1 | * | 4/2005 | Ohnuma ................... 257/75 |
| 6,953,979 | B1 | * | 10/2005 | Yamaguchi et al. .......... 257/446 |
| 6,958,266 | B2 | * | 10/2005 | Yamaguchi et al. .......... 438/219 |
| 7,037,765 | B2 | * | 5/2006 | Yamazaki et al. ........... 438/149 |
| 7,071,041 | B2 | * | 7/2006 | Yamazaki et al. ........... 438/166 |
| 7,087,962 | B1 | | 8/2006 | Codama |
| 7,271,457 | B2 | | 9/2007 | Quinn |
| 7,348,227 | B1 | * | 3/2008 | Yamazaki et al. ........... 438/166 |
| 7,429,751 | B2 | * | 9/2008 | Yamazaki et al. ........... 257/59 |
| 7,564,059 | B2 | | 7/2009 | Yamazaki |
| 7,772,089 | B2 | * | 8/2010 | Tanaka .................... 438/458 |
| 7,816,195 | B2 | * | 10/2010 | Yamazaki et al. ........... 438/166 |
| 8,030,169 | B2 | * | 10/2011 | Kakehata et al. ........... 438/404 |
| 8,143,134 | B2 | * | 3/2012 | Shichi et al. ............... 438/311 |
| 8,236,668 | B2 | * | 8/2012 | Ohnuma et al. ............. 438/458 |
| 2001/0009288 | A1 | | 7/2001 | Kojima et al. |
| 2001/0040255 | A1 | * | 11/2001 | Tanaka .................... 257/342 |
| 2006/0197121 | A1 | | 9/2006 | Quinn |
| 2006/0220021 | A1 | * | 10/2006 | Yamazaki et al. ........... 257/59 |
| 2006/0267074 | A1 | * | 11/2006 | Yoneda .................... 257/315 |
| 2008/0003813 | A1 | | 1/2008 | Nam et al. |
| 2008/0048241 | A1 | | 2/2008 | Fujiwara et al. |
| 2008/0090425 | A9 | * | 4/2008 | Olsen ..................... 438/786 |
| 2008/0213954 | A1 | * | 9/2008 | Yamazaki et al. ........... 438/166 |
| 2009/0098739 | A1 | * | 4/2009 | Ohnuma et al. ............. 438/781 |
| 2009/0137101 | A1 | * | 5/2009 | Yamazaki et al. ........... 438/479 |
| 2009/0209086 | A1 | * | 8/2009 | Tanaka .................... 438/458 |
| 2010/0006940 | A1 | * | 1/2010 | Kakehata et al. ........... 257/347 |
| 2010/0087044 | A1 | * | 4/2010 | Shichi et al. ............... 438/458 |
| 2011/0033988 | A1 | * | 2/2011 | Yamazaki et al. ........... 438/151 |
| 2011/0316082 | A1 | * | 12/2011 | Kakehata et al. ........... 257/347 |
| 2012/0001332 | A1 | * | 1/2012 | Tanaka .................... 257/751 |
| 2012/0003787 | A1 | * | 1/2012 | Tanaka et al. .............. 438/96 |
| 2012/0021570 | A1 | * | 1/2012 | Tajima et al. .............. 438/157 |
| 2012/0061676 | A1 | * | 3/2012 | Egi et al. .................. 257/60 |
| 2012/0164817 | A1 | * | 6/2012 | Shichi et al. ............... 438/458 |
| 2012/0187408 | A1 | * | 7/2012 | Tanaka et al. .............. 257/64 |
| 2012/0289005 | A1 | * | 11/2012 | Tanaka et al. .............. 438/158 |

FOREIGN PATENT DOCUMENTS

| | | | |
|---|---|---|---|
| JP | 59-161870 | A | 9/1984 |
| JP | 64-007559 | A | 1/1989 |
| JP | 03-020046 | A | 1/1991 |
| JP | 03-189626 | A | 8/1991 |
| JP | 04-290467 | A | 10/1992 |
| JP | 04-302147 | A | 10/1992 |
| JP | 05-082552 | A | 4/1993 |
| JP | 06-029834 | A | 2/1994 |
| JP | 08-204208 | A | 8/1996 |
| JP | 08-228145 | A | 9/1996 |
| JP | 08-274344 | A | 10/1996 |
| JP | 2000-208870 | A | 7/2000 |
| JP | 2001326353 | A * | 11/2001 |

* cited by examiner

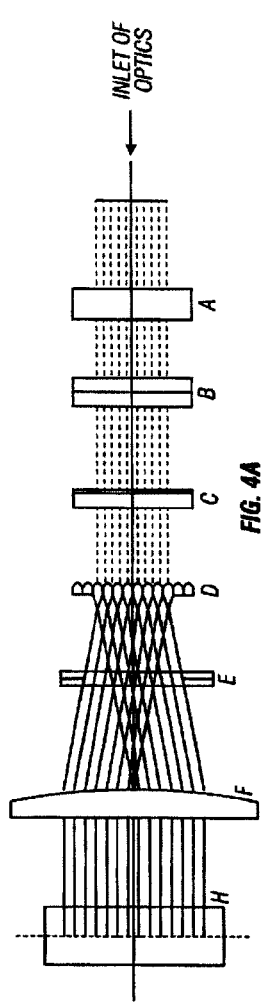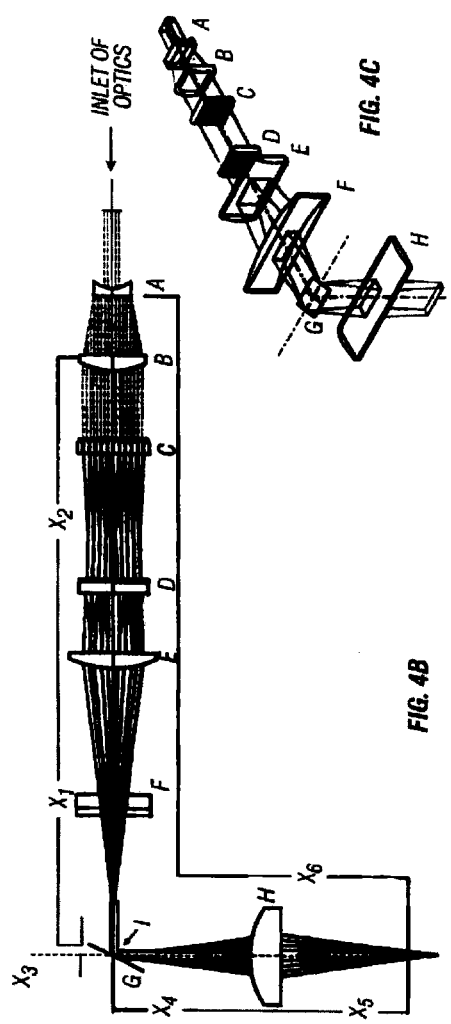

SEMICONDUCTOR DEVICE AND MANUFACTURING METHOD THEREOF

CROSS-REFERENCE TO RELATED APPLICATIONS

This application is a divisional of U.S. application Ser. No. 12/041,014, filed Mar. 3, 2008, now allowed, which is a divisional of U.S. application Ser. No. 09/451,665, filed Nov. 30, 1999, now U.S. Pat. No. 7,348,227, which is a continuation of U.S. application Ser. No. 08/908,281, filed Aug. 7, 1997, now U.S. Pat. No. 6,353,244, which is a continuation of U.S. application Ser. No. 08/620,462, filed Mar. 22, 1996, now abandoned, which claims the benefit of a foreign priority application filed in Japan as Serial No. 7-090157 on Mar. 23, 1995, all of which are incorporated by reference.

BACKGROUND OF THE INVENTION

1. Field of the Invention

The present invention relates to reduction of power consumption of a thin-film semiconductor circuit constituted of crystalline silicon. The invention also relates to reduction of power consumption of a drive circuit of an active matrix display device that is constituted of crystalline silicon.

The invention also relates to an ion doping technique for a semiconductor material, and a manufacturing method of a semiconductor and a semiconductor device using that ion doping technique.

Further, the invention relates to reduction of a leak current while a thin-film transistor (hereinafter abbreviated as "TFT") is off.

2. Description of the Related Art

In recent years, extensive studies have been made of the active matrix display device using a liquid crystal. In the active matrix display device, a switching element is provided for each pixel and a signal coming from an image signal line is supplied to each pixel through the corresponding switching element.

Although previously TFTs using an amorphous silicon semiconductor were used as the switching element, in recent years TFTs have been developed which use a crystalline silicon semiconductor (i.e., a silicon semiconductor including crystal components) having a high operation speed.

However, in a TFT using a crystalline silicon semiconductor, the leak current (off-current) that flows when the gate electrode is reversely biased is larger than in a TFT using an amorphous silicon semiconductor.

This phenomenon, which is believed due to the existence of crystal grain boundaries, is the most serious problem, because it deteriorates the characteristics of a crystalline silicon-based circuit constituting an active matrix display device and increases its power consumption.

In the case of an N-channel TFT, when $V_{GS}$ (source-gate voltage of the TFT) is negative, a leak current is determined by currents flowing through PN junctions that are formed between a P-type layer that is induced in the surface of a semiconductor thin film and N-type layers of source and drain regions. Because of many traps existing in the semiconductor thin film (particularly in grain boundaries), these PN junctions are incomplete, likely causing a relatively large junction leak current.

The reason why the leak current increases as the gate electrode is negatively biased more deeply is that the carrier concentration of the P-type layer formed in the surface of the semiconductor thin film increases, which lowers the energy barrier height of the PN junction, which in turn causes an electric field concentration, resulting in increase of the junction leak current.

The leak current that is caused by the above mechanism strongly depends on the source-drain voltage; that is, the leak current rises sharply as the voltage applied between the source and the drain of a TFT is increased. For example, in some cases, a leak current with a source-drain voltage of 10 V is more than 10 times, rather than 2 times, larger than that with a source-drain voltage of 5 V.

The above nonlinearity also depends on the gate voltage. In general, the leak current difference between the above two cases is larger when the gate electrode is reversely biased more deeply (in an N-channel TFT, when a larger negative voltage is applied).

Typical examples of products using the active matrix display device include a notebook-type personal computer and a portable information terminal. However, in current models of these products, the active matrix display device is responsible for most of the total power consumption. Therefore, to satisfy the need of long-term driving by a battery, it is now desired to reduce the power consumption of the active matrix display device.

However, even where a peripheral drive circuit of an active matrix display device are constituted of CMOS (complementary metal-oxide-semiconductor) TFTs, large leak currents flow through the P-channel TFTs in an off state, making the power consumption of the entire circuit large.

In the case of a high-resolution, large-screen type active matrix display device, long gate lines of the screen cause a problem that there is a delay until the TFT of a selected pixel is turned on. A wiring resistance $R_{wire}$ and a wiring capacitance $C_{wire}$ of a gate line are approximated as $$R_{wire} = \rho \cdot L/(W \cdot T)$$

$$C_{wire} = n_{ox} \cdot W \cdot L/H$$

where
 $\rho$: resistivity of a wiring material
 L: wiring length
 W: wiring width
 T: wiring film thickness
 $n_{ox}$: dielectric constant of a field oxide film.
A delay $t_{wire}$, which is equal to a time constant $R_{wire} \cdot C_{wire}$, is expressed as $$t_{wire} = \rho \cdot n_{ox} \cdot L^2/(T \cdot H).$$

This equation indicates that the signal delay due to a wiring line is proportional to the square of the wiring length.

Conventionally, the signal delay due to a wiring line is prevented by reducing the wiring length of gate lines by providing a gate line drive circuit on both sides of the active matrix display device. However, this measure is not sufficient.

SUMMARY OF THE INVENTION

In view of the above problems, an object of the present invention is to provide a thin-film semiconductor integrated circuit formed on crystalline silicon and, in particular, a peripheral drive circuit of an active matrix liquid crystal display device which circuits are low in power consumption.

Another object of the invention is to provide a pixel-switching thin-film transistor of an active matrix liquid crystal device which transistor can prevent a signal delay due to a wiring line.

A further object of the invention is to provide a method for forming thin-film transistors having different threshold voltages ($V_{th}$) on the same substrate.

As described above, the leak current in a CMOS circuit as a thin-film semiconductor integrated circuit formed on crystalline silicon can be reduced by decreasing the source-drain voltage.

To this end, according to the invention, a P-channel TFT and an N-channel TFT are connected to the respective source electrodes of a P-channel TFT and an N-channel TFT of a CMOS circuit. The threshold voltages of the additional P-channel and N-channel TFTs are made higher than those of the TFTs of the CMOS circuit. Thus, by making the additional P-channel and N-channel TFTs in an off state, the CMOS circuit can be separated from a power supply when it is not in use.

Since the TFTs of the CMOS circuit are lower, the leak current of the CMOS circuit is reduced. Thus, the power consumption of an integrated circuit constituted of thin-film transistors can be reduced.

According to another aspect of the invention, pixel TFTs are constructed such that the threshold voltage of each TFT is determined in consideration of a voltage drop due to a wiring resistance of a gate line of an active matrix display device. That is, the TFTs are constructed such that a TFT more distant from a gate line drive circuit has a lower threshold voltage. As a result, the gate voltage of a pixel TFT that is about to be driven is lower than in the conventional case. Therefore, the wiring capacitance of a gate line can be shortened, so that pixel TFTs distant from the gate line drive circuit can be turned on in shorter time than in the conventional case.

A description will be made of a method for making the threshold voltages of a plurality of thin-film transistors formed on the same substrate different from one another, to realize the above-described configurations.

In recent years, it has been attempted to dope the channel region of a thin-film transistor (TFT). In the following, this technique is called "channel doping."

The channel doping enables control of $V_{th}$ (threshold voltage). Although inherently $V_{th}$ should be 0 V (actually, $I_D$ (drain current) approximately has a minimum value when $V_G$ (gate voltage) is 0 V), it may deviate much from 0 V when a semiconductor material is processed to enhance its crystallinity or improve its uniformity. Other factors may also deviate $V_{th}$ from 0 V. In any case, $V_{th}$ can be restored to about 0 V by proper channel doping.

Whether an N-type dopant (a doped semiconductor exhibits N-type conductivity) or a P-type dopant (a doped semiconductor exhibits P-type conductivity) should be used depends on the direction (negative side or positive side) of the $V_{th}$ deviation. The dose of channel doping is changed in accordance with the amount of $V_{th}$ deviation.

That is, no matter how $V_{th}$ deviates, it can be restored to about 0 V by adjusting the dose of channel doping. Further, fine adjustment of $V_{th}$ can be done by changing the dose.

In general, the dose of channel doping is lower than that for source/drain implantation.

Annealing is performed after doping to repair lattice defects that have been produced by a large amount of dopant implanted into a semiconductor material.

A method for intentionally making $V_{th}$'s of a plurality of thin-film transistors different from one another will be described below. It is possible to give different $V_{th}$'s to respective transistors by changing doses in doping the channel regions of those transistors, as described above.

FIG. 2 shows a concentration profile of a dopant implanted into a silicon film by doping.

To control the concentration for an individual thin-film transistor, the nature of doping which exhibits the concentration profile of FIG. 2 in a doped object is utilized. In FIG. 2, the vertical axis represents the concentration and the horizontal axis represents the depth from the surface of a doped object.

As seen from FIG. 2, the concentration covers a range of about three orders in the depth direction.

This type of profile allows the following concentration adjustment. That is, in forming a thin-film transistor, a control film, for instance, a silicon oxide film, that can be stripped off in a later step is formed on the surface of the channel region of the thin-film transistor, and doping is performed from above the control film. In this manner, the concentration of an impurity introduced into the channel region can be adjusted.

In this method, a concentration profile is provided in a single substrate in doping it with a single dopant. However, this method can vary $V_{th}$ only in one direction (i.e., positive or negative direction).

This problem can be solved by implanting different kinds of dopants into different regions.

Further, to produce both of thin-film transistors in which $V_{th}$ is not shifted at all and those in which $V_{th}$ is shifted, undoped regions and doped regions may be formed.

The above techniques of controlling $V_{th}$ can be used to make $V_{th}$'s of individual thin-film transistors constituting a circuit different from one another, but also to eliminate differences among $V_{th}$'s of respective thin-film transistors, i.e., to make $V^{th}$'s uniform.

BRIEF DESCRIPTION OF THE DRAWINGS

FIG. 4 is an optical path diagram inside an optics used in the laser annealing apparatus of FIG. 3;

DETAILED DESCRIPTION OF THE PREFERRED EMBODIMENTS

Embodiment 1

In this embodiment, a channel doping step is inserted in a process of forming a plurality of thin-film transistors on the same substrate. In particular, this embodiment is directed to a manufacturing method of thin-film transistors having superior circuit characteristics.

More specifically, this embodiment relates to a technique of improving the characteristics of the entire circuit or reduce the power consumption of the entire circuit by making $V_{th}$ values of transistors different from one anther by controlling $V_{th}$'s by use of a channel doping technique.

In this embodiment, a description will be made of part of a process to a channel doping step. Transistors can be completed by an ordinary method by using a silicon film produced by this embodiment.

First, thin-film transistors in the midst of their manufacture. i.e., before being subjected to doping are prepared. Although the term "thin-film transistors" is used here, at this stage they merely include a 500-Å-thick silicon film formed on a glass substrate (Corning 7059) and a 1,200-Å-thick silicon oxide film formed thereon. Naturally the thicknesses of these films may be set as desired.

The silicon oxide film is a control film for controlling the dose of a dopant to be implanted into a channel portion. The control film may be a silicon nitride film. Details will be described later.

The reason why the channel doping is performed at this stage is that the channel portion of a planar thin-film transistor is usually located under the gate electrode and therefore doping should be performed before formation of the gate electrode. The silicon film as used here means a film mainly made of silicon, and has an amorphous structure or a crystalline structure having crystal components such as a microcrystalline or polycrystalline structure.

Figure 1:
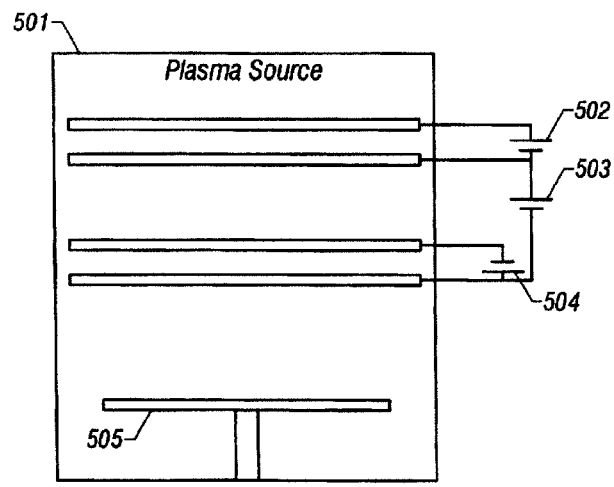
FIG. 1 shows a general configuration of a doping apparatus.

Next, a doping apparatus will be described briefly. FIG. 1 shows a general configuration of a doping apparatus.

Plasma is generated in a plasma source 501 (top portion of FIG. 1), and ions existing in the plasma are accelerated by an electric field developing in an ion acceleration region that is located under the plasma source 501. As shown in FIG. 1, three power supplies, i.e., a drawing power supply 502, an acceleration power supply 503, and a deceleration power supply 504 are provided to apply voltages to three respective electrodes arranged from the top. In an actual doping operation, voltages are applied to the three electrodes in the order of arrangement starting from the lowest one. A substrate holder 505 incorporates a heater to keep the substrate at an arbitrary temperature.

An actual doping operation is performed in the following manner. Boron is used as a dopant in the following example. (Other dopants may be used; that is, the dopant is changed in accordance with the purpose of a doping operation.)

In this embodiment, a 5%-dilution diborane gas is used. A diborane gas is introduced into the plasma source 501 of the doping apparatus, and a substrate having thin-film transistors in the midst of their manufacture, i.e., before doping is placed on the substrate holder 505 (see FIG. 1). At this time, the heater incorporated in the substrate holder 505 is so set as to provide a substrate temperature of 50 to 500° C. By keeping the substrate at a high temperature, the activation of a semiconductor substrate under doping can be accelerated.

Subsequently, the ion acceleration region is vacuumized, and the diborane gas is introduced therein from the plasma source 501. Immediately after application of a deceleration voltage of −1 kV from the deceleration power supply 504, an acceleration voltage of 27 kV is applied from the acceleration power supply 503 and this state is maintained for 5 seconds. Finally, a drawing voltage that is supplied from the drawing power supply 502 is continuously raised to 3 kV in 1 second.

Figure 2:
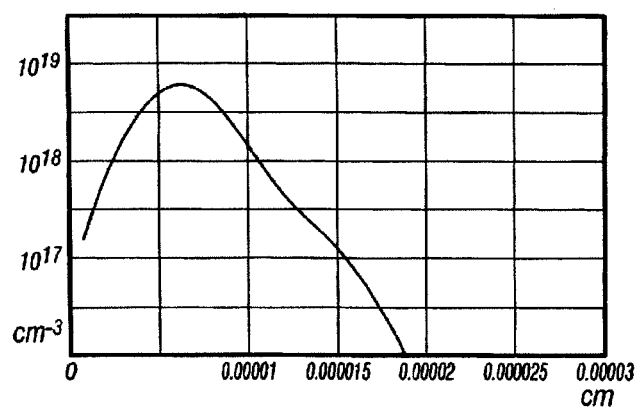
FIG. 2 shows a concentration profile of a dopant implanted into a silicon film by doping.

As a result of the above operation, boron is implanted into the silicon oxide film (control film; including its surface region) and the silicon film with a profile shown in FIG. 2. FIG. 2 shows a concentration profile of boron that is implanted into the silicon oxide film and the silicon film, in which the horizontal axis represents the depth from the surface of the silicon oxide film and the vertical axis represents the boron concentration.

As seen from FIG. 2, a profile from a depth 1,200 Å to 1,700 Å is such that the dopant is implanted at $6 \times 10^{16}$ to $6 \times 10^{17}$ atoms/cm$^3$. This profile is due to a light ion species $BH_x$ that mainly consists of one boron atom.

On the other hand, a profile from the surface to a depth 1,200 Å assumes a mountainous shape, and has a maximum dopant concentration of $7 \times 10^{18}$ atoms/cm$^3$.

This mountainous profile is due to a heavy ion species $B_2H_y$ that mainly consists of two boron atoms. This portion does not influence the characteristics of TFTs at all, because it corresponds to the silicon oxide film.

The reason why the silicon oxide film is formed is to dope the silicon film at a low concentration of about $1 \times 10^{17}$ atoms/cm$^3$. (It is difficult for currently available doping apparatuses to directly realize a low concentration of about $1 \times 10^{17}$ atoms/cm$^3$.)

The above concentration values are presented just for reference, and a dopant may be implanted at a desired dose in accordance with a purpose of doping. Experiments conducted by the inventors have revealed that in channel doping a dopant may be implanted at a lower dose than in source/drain doping, and that the threshold voltage control can be performed properly if the concentration falls within a range of $5 \times 10^{15}$ to $5 \times 10^{17}$ atoms/cm$^3$.

By using the above-described doping technique, the concentration of a dopant implanted into a channel region can be made different from one transistor to another. Techniques necessary for that purpose will be described below.

1. A Method for Forming Devices Without Channel Doping and Devices with Channel Doping on the Same Substrate.

This can be done simply by masking, during a doping operation, a region that should not be doped. Specifically, a resist film is formed on the above-mentioned silicon oxide film (control film), and then patterned. Since a region under the resist film is not doped, a portion to be doped and a portion not to be doped can be discriminated from each other. After the doping operation, the silicon oxide film and the resist film are removed. Any films other than a resist film can be used as long as they have the same function as the resist film.

2. A Method for Implanting the Same Kind of Dopant into a Plurality of Regions at Different Concentrations.

Figure 5:
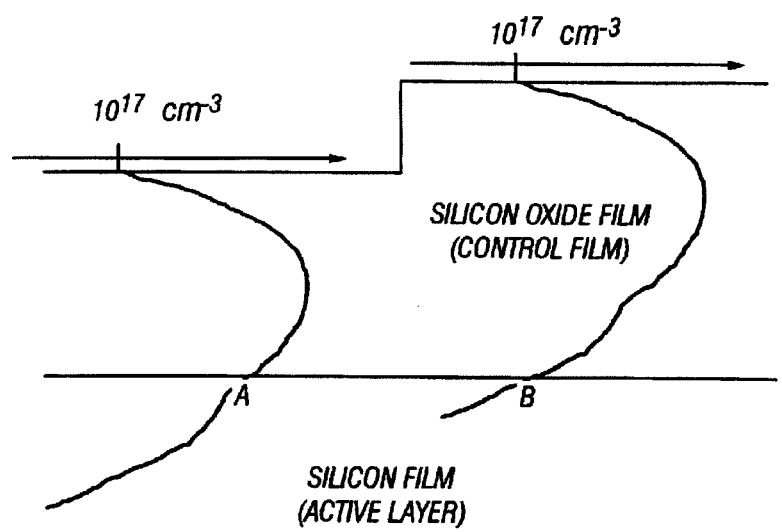
FIG. 5 shows concentration profiles in a case where a silicon oxide film has two different thicknesses.

This can be done by forming silicon oxide films (control films) for respective regions at different thicknesses; and conducting doping from above the thus-formed silicon oxide films. According to this method, the concentration of a dopant implanted into a silicon film that exists under a silicon oxide film can be made lower by making the silicon oxide film thicker. FIG. 5 shows a concentration profile of boron in which a silicon oxide film have two different thicknesses of 1,000 Å and 1,500 Å.

A doping step according to this method is performed under the same conditions as the above-described doping step. The doping apparatus shown in FIG. 1 is used, and a 5%-dilution diborane is used as a doping gas. The substrate temperature is kept at 50 to 500° C., and the diborane gas is introduced into the ion acceleration region that is being vacuumized. Immediately after a deceleration voltage of −1 kV is applied from the deceleration power supply 504, an acceleration voltage of 27 kV is applied from the acceleration power supply 503 and this state is maintained for 5 seconds. Finally, a drawing voltage that is supplied from the drawing power supply 502 is continuously raised to 3 kV in 1 second.

As a result of the above operation, boron is implanted into the silicon oxide film (control film; including its surface region) and the silicon film with a profile shown in FIG. 5. The boron concentration is about $10^{18}$ atoms/cm$^3$ at surface A of the 1,000-Å-thick silicon oxide film and about $10^{17}$ atoms/ cm³ at surface B of the 1,500-Å-thick silicon oxide film. In this manner, the dopant concentration in the silicon film can easily be controlled by varying the thickness of the silicon oxide film (control film).

To vary the thickness of the silicon oxide film, a resist film is formed on the silicon oxide film, patterned, and then etched to a desired thickness. The resist film is then removed, leaving a silicon oxide film having different thicknesses for respective regions.

3. A Method for Implanting Different Kinds of Dopants into Respective Regions.

Method 1 is utilized. A simple procedure is to conduct method 1 two times, but it includes too many steps. Therefore, only a resist film is removed after the first doping operation, and a new resist film is formed. After the new resist film is patterned with a different pattern from the first one, and the second doping operation is performed.

Although the above three methods are intended to dope two regions differently, they may be used to dope three or more regions differently. These methods enable fine control of $V_{th}$'s from one device to another.

After the doping step described above, thermal annealing is performed to repair lattice defects that have been produced by a large amount of dopant implanted into a semiconductor material.

Thereafter, a silicon film obtained in the above manner is processed to form gate insulating films, gate electrodes, source/drain electrodes, passivation films, pixel electrodes, etc. Thus, thin-film transistors having different threshold voltages can be formed on the same substrate.

Embodiment 2

A laser annealing step is inserted after the step of the first embodiment or performed instead of the thermal annealing, to further reduce lattice defects in the silicon oxide film, improve the crystallinity, and distribute the dopant uniformly over the entire substrate.

The silicon oxide film is removed by etching before the laser annealing.

Figure 3:
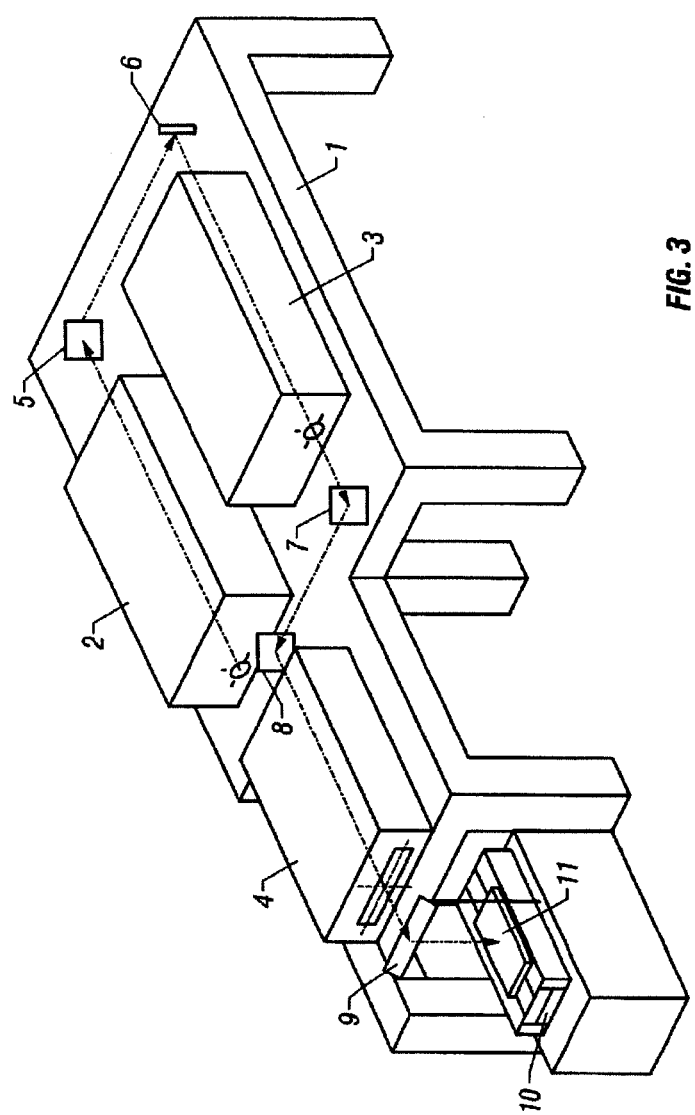
FIG. 3 shows the concept of a laser annealing apparatus used in a second embodiment.

First, a description will be made of a laser apparatus. FIG. 3 shows the concept of a laser annealing apparatus used in this embodiment. KrF excimer laser light (wavelength: 248 nm; pulse width 25 ns) is emitted from an oscillator 2. Apparently other excimer lasers and other types of lasers may also be used.

The laser light emitted from the oscillator 2 is reflected by full-reflection mirrors 5 and 6, amplified by an amplifier 3, reflected by full-reflection mirrors 7 and 8, and introduced into an optics 4. Immediately before entering the optics 4, the laser beam has a rectangular shape of 3×2 cm². The laser beam is shaped by the optics 4 into a long and narrow beam (linear beam) of 10 to 30 cm in length and 0.1 to 1 cm in width. The laser beam as output from the optics 4 has a maximum energy of 1,000 mJ/shot.

The reason for shaping the laser beam into the long and narrow beam is to improve its processing ability. The linear laser beam output from the optics 4 is reflected by a full-reflection mirror 9, and applied to a sample 11. Since the laser beam is longer than the width of the sample, it can illuminate the entire sample 11 if the sample 11 is moved in one direction. Therefore, a sample stage/driving device 10 for the sample 11 is simple in structure and can be maintained easily. In addition, an alignment operation in setting the sample 11 can be performed easily.

The sample stage 10 which is to be illuminated with the laser beam is controlled by a computer, and is so designed as to move perpendicularly to the linear laser beam. The stage 10 is provided with a heater to keep the sample 11 at a prescribed temperature during laser beam illumination.

FIG. 4 is an optical path diagram inside the optics 4. The laser beam that has been input to the optics 4 passes through a cylindrical concave lens A, a cylindrical convex lens B, and horizontal and vertical flyeye lenses C and D, so that its Original Gaussian distribution is converted into a rectangular distribution. Then, the laser beam is passed through cylindrical convex lenses E and F, reflected by a mirror G (which corresponds to the mirror 9 in FIG. 3), focused by a cylindrical lens H, and finally applied to the sample 11.

A specific laser beam illuminating operation is as follows. The laser beam is shaped into a rectangular form by the beam shape converting lenses to provide an illuminating beam area of 125 mm×1 mm. The sample 11, which is mounted on the stage 10, is moved at a rate of 2 mm/s to allow illumination of its entire surface.

As for the laser beam illumination conditions, two-step illumination consisting of preliminary illumination of 150 to 250 mJ/cm² and main illumination of 200 to 380 mJ/cm² and the pulse rate is set at 300 pulses/s. The reason for employing the two-step illumination is to minimize degradation of the uniformity of a film surface due to the laser beam illumination, to thereby produce a film having better crystallinity.

The substrate temperature is kept at 200° C. during the laser beam illumination to reduce the speed of increase and decrease of the substrate surface temperature due to the laser beam illumination. Although in this embodiment the substrate temperature is set at 200° C., in practice it is set at a temperature most suitable for laser annealing in a range of 100 to 600° C. No particular atmosphere control is performed; that is, the illumination is conducted in the air.

Instead of using laser light, strong light equivalent to laser light, for instance, infrared light may be applied by using an infrared lamp.

Embodiment 3

Figure 6:
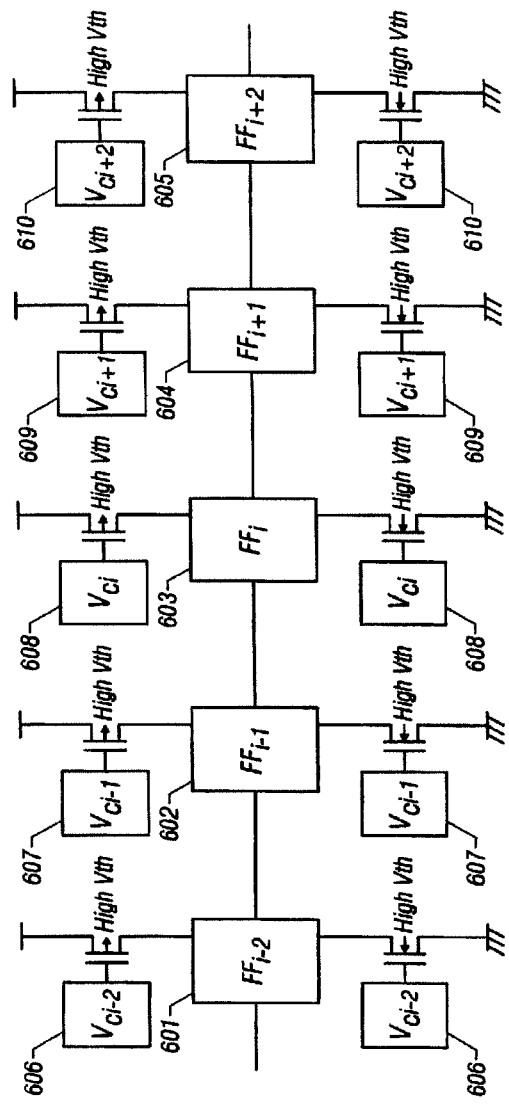
FIG. 6 shows a general configuration of a shift register circuit of an active matrix display device according to a third embodiment of the invention.

FIG. 6 shows a shift register circuit constituting a drive circuit of an active matrix display device which circuit can reduce leak current.

One output of the shift register is produced by one timing generation circuit and two voltage control circuit.

Figure 7:
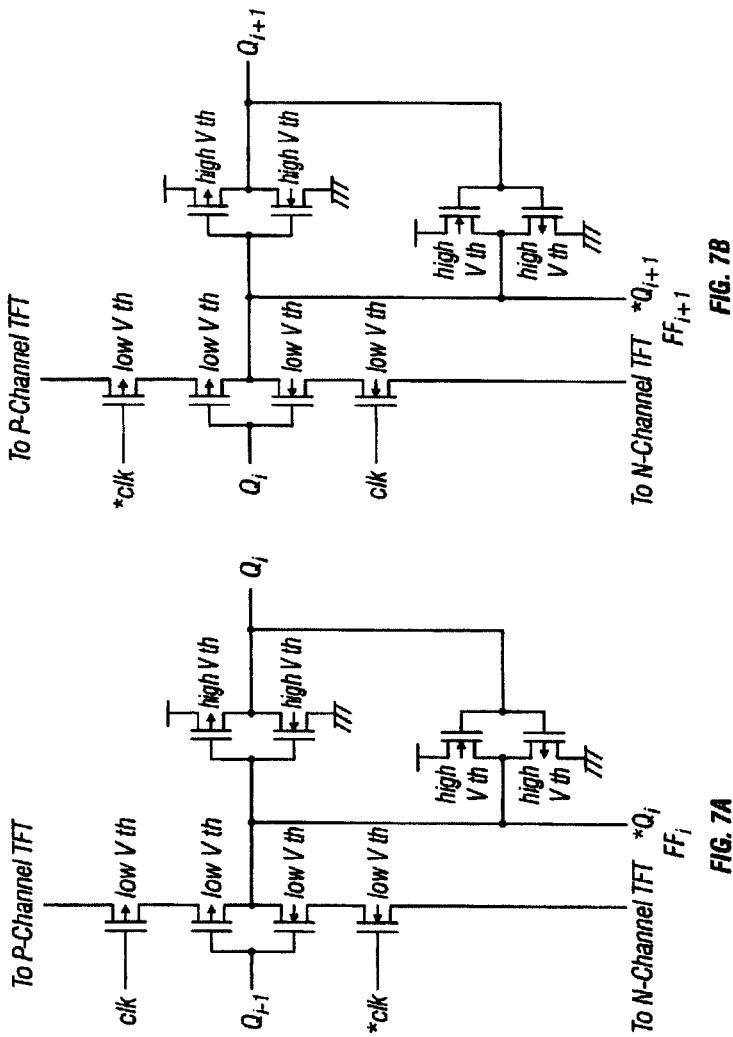
FIG. 7 is a circuit diagram of timing generation circuits that constitute the shift register circuit of FIG. 6.

$FF_{i-2}$ to $FF_{i+2}$ are timing circuits, whose configuration is shown in FIG. 7. Each of the timing generation circuits $FF_{i-2}$ to $FF_{i+2}$ consists of one clocked inverter that is constituted of thin-film transistors having a low threshold voltage $V_{th}$ and two inverters each constituted of thin-film transistors having a high threshold voltage $V_{th}$.

These thin-film transistors having different threshold voltages are ones that have been manufactured by the method of the first embodiment.

The timing generation circuits $FF_{i-2}$ to $FF_{i+2}$ generate scanning timing or image signal output timing of the active matrix display device.

In FIG. 7, clk is an operation clock signal for the timing generation circuit $FF_i$, and *clk (logical inversion signal of clk) is an operation clock signal for the timing generation circuit $FF_{i+1}$. $Q_i$ and $Q_{i+1}$ are output signals of the timing generation circuits $FF_i$ and $FF_{i+1}$, respectively, i.e., output signals of the shift register. *$Q_i$ and *$Q_{i+1}$ are logical inversion signals of the signals $Q_i$ and $Q_{i+1}$, respectively. The timing generation circuit $FF_i$ receives the signal $Q_{i-1}$ and outputs the signals $Q_i$ and *$Q_i$. The timing generation circuit $FF_{i+1}$ receives the signal $Q_i$ and outputs the signals $Q_{i+1}$ and *$Q_{i+1}$.

Figure 8:
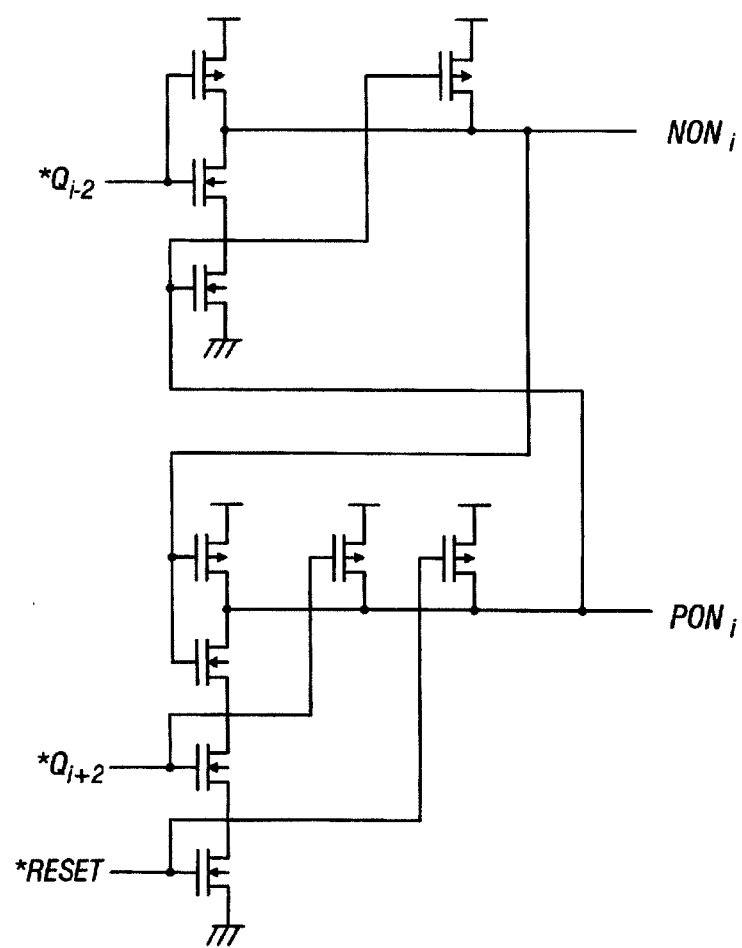
FIG. 8 is a circuit diagram showing a voltage control circuit that constitutes the shift register of FIG. 6.

$VC_{i-2}$ to $VC_{i+2}$ are voltage control circuits. FIG. 8 is a circuit diagram of the voltage control circuit $VC_i$, which is an SR latch consisting of one two-input NAND having a high threshold voltage and one three-input NAND having a large threshold voltage. The voltage control circuit $VC_i$ controls separation from a power supply of the timing generation circuit $FF_i$.

In FIG. 8, $PON_i$ is a signal for on/off-controlling a P-channel TFT that is connected to the timing generation circuit $FF_i$, and $NON_i$ is a signal for on/off-controlling an N-channel TFT that is connected to the timing generation circuit $FF_i$. *RESET is a signal that is input for a certain period after the power-on to prevent the voltage control circuit $VC_i$ (SR latch) from producing contradictory outputs and thereby fix the logic.

The operation of the above shift register circuit will be described below.

Upon reception of a pulse signal $Q_{i-1}$, the ith-stage timing generation circuit $FF_i$ produces output signals $Q_i$ and $*Q_i$ that are clock-synchronized by the clocked inverter. The output signal $Q_i$ serves both as a timing signal for the active matrix display device and an input pulse for the timing generation circuit $FF_{i+1}$ of the next stage, i.e., the (i+1)th stage.

The output signal $*Q_i$ is input to the voltage control circuit $VC_{i+2}$, and makes output signals $PON_{i+2}$ and $NON_{i+2}$ active. As a result, the timing generation circuit $FF_{i+2}$ is connected to the power supply.

At the same time, the output signal $*Q_i$ is input to the voltage control circuit $VC_{i-2}$, which makes output signals $PON_{i-2}$ and $NON_{i-2}$ non-active. As a result, the timing generation circuit $FF_{i-2}$, which has already produced an output signal, is separated from the power supply.

In this embodiment, where the shift register produces n-stage outputs, (n+2) timing circuits and (2n−4) voltage control circuits are needed for the following reason. To perform voltage control (separation from the power supply) of the (n−1)th-stage and nth-stage timing generation circuits, (n+1)th-stage and (n+2)th stage timing circuits are needed, which means (2n+4) voltage control circuits are necessary. However, to prevent oscillation of the shift register (timing control circuits) after the power-on, two voltage control circuits of each of the first-stage and second-stage (head portion) timing generation circuits and the (n+1)th-stage and (n+2)th-stage (tail portion) timing generation circuits should not be provided. Therefore, (2n−8), i.e., (2n+4) minus 8, voltage control circuits are sufficient.

In this embodiment, in the shift register circuit shown in FIG. 6, the TFTs of the voltage control circuits and the P-channel and N-channel TFTs connected to the voltage control circuits are constituted of TFTs having a high threshold voltage, and the timing control circuit (clocked inverter) is separated from the power supply by means of the thus-constructed voltage control circuits. Further, since the TFTs constituting the timing control circuit (clocked inverter) have a lower threshold voltage than the TFTs connected to the voltage control circuits, the leak current can be reduced from the conventional case. In addition, since the inverter of the timing generation circuit holds the output signal, no leak current flows through it, which contributes to reduction of the power consumption of the active matrix display device.

Embodiment 4

This embodiment is directed to an example of an arrangement of pixel TFTs having increased switching speed in an active matrix display device.

Figure 9:
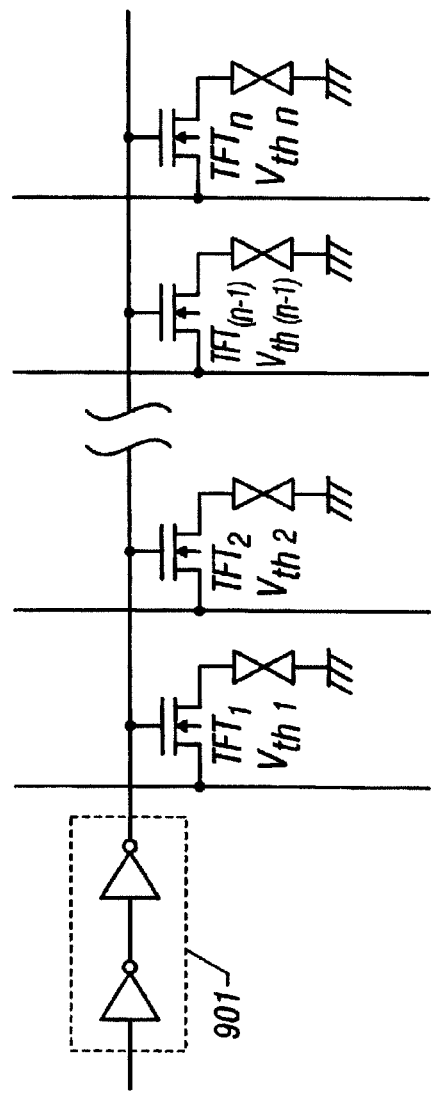
FIG. 9 shows a general configuration of a gate line drive circuit and pixel TFTs of an active matrix display device according to a fourth embodiment of the invention.

FIG. 9 shows a general configuration of a gate line drive circuit and pixel TFTs of an active matrix display device according to this embodiment.

A gate line drive circuit 901 is constituted of a series connection of inverters.

$TFT_1$ to $TFT_n$ are N-channel pixel TFTs, which have been manufactured according to the method of the first embodiment so that threshold voltages $V_{th1}$ to $V_{thn}$ of the respective TFTs satisfy a relationship $V_{th1} \geq V_{th2} \geq \ldots \geq V_{th(n-1)} \geq V_{thn}$. That is, a pixel TFT more distant from the gate line drive circuit 901 has a lower threshold voltage.

With the above configuration, a TFT more distant from the gate line drive circuit 901 can be given a lower gate voltage. As a result, the charging time of the wiring capacitance of a gate line can be shortened, so that the pixel TFTs distant from the gate line drive circuit 901 can be turned on in shorter time than in the conventional case.

Thus, in the active matrix display device, the gate line drive circuit 901 can turn on the pixel TFTs in shorter time than in the conventional case.

As described above, according to the invention, it becomes possible to reduce leak current and therefore power consumption of a thin-film semiconductor integrated circuit made of crystalline silicon and, in particular, a peripheral drive circuit of an active matrix display device.

It becomes possible to form, on the same substrate, TFTs having two or more different threshold voltages.

Further, in pixel TFTs of the display portion of an active matrix display device, pixel TFTs distant from a gate line drive circuit can be turned on in shorter time than in the conventional case.

In summary, the invention makes it possible to improve the circuit characteristics by controlling the threshold voltages $V_{th}$ of thin-film transistors made of crystalline silicon.

What is claimed is:

1. A method of manufacturing a semiconductor device comprising the steps of:
    forming a semiconductor film on an insulating surface;
    forming an insulating film on the semiconductor film;
    introducing a first dopant impurity into the semiconductor film through the insulating film by a first ion doping; and
    annealing the semiconductor film,
    wherein a peak of a concentration profile of the first dopant impurity is located above the insulating surface.

2. The method according to claim 1 wherein the semiconductor film comprises polycrystalline silicon.

3. The method according to claim 1 further comprising the steps of:
    forming a gate electrode over the insulating film, and
    forming a channel region in the doped region of the semiconductor film by introducing a second dopant impurity into the semiconductor film by a second ion doping by using the gate electrode as a mask.

4. The method according to claim 1,
    wherein the semiconductor film is a crystalline semiconductor film,
    wherein the crystalline semiconductor film has a portion to become a channel region, and
    wherein the first dopant impurity is introduced into at least the portion, and the method according to claim 1 further comprising the steps of:
    forming a gate electrode over the portion with the insulating film interposed between the crystalline semiconductor film and the gate electrode; and
    forming a channel region in the doped region of the crystalline semiconductor film by introducing a second dopant impurity into the crystalline semiconductor film by a second ion doping by using the gate electrode as a mask.

5. The method according to claim 1 further comprising the steps of:
    removing the insulating film after the first ion doping and before the annealing step;

forming a channel region in the doped region of the semiconductor film by introducing a second dopant impurity into the semiconductor film by a second ion doping, wherein the semiconductor device has a thin film transistor, wherein the first dopant impurity is introduced into at least a portion of the semiconductor film, and wherein the portion constitutes the channel region of the thin film transistor.

6. The method according to claim 1 wherein the insulating film comprises silicon oxide.

7. The method according to claim 1 further comprising a step of removing the insulating film.

8. The method according to claim 1 wherein the first dopant impurity is boron.

9. The method according to claim 8 wherein the boron is supplied by diborane gas.

10. The method according to claim 1 wherein the concentration is within a range from $5\times10^{15}$ atoms/cm$^3$ to $5\times10^{17}$ atoms/cm$^3$.

11. The method according to claim 1 wherein the annealing step is conducted by a heating.

12. The method according to claim 1 further comprising a step of irradiating the semiconductor film with a laser light.

13. The method according to claim 1 wherein the semiconductor device comprises an active matrix display device having thin-film transistors.

14. The method according to claim 1 wherein the semiconductor device comprises a shift register circuit having thin-film transistors.

15. The method according to claim 1, wherein the peak of the concentration profile of the first dopant impurity is located in the insulating film.

16. The method according to claim 1, wherein the semiconductor film is a crystalline semiconductor film.

17. The method according to claim 1 wherein the semiconductor film has a portion to become a channel region.

18. The method according to claim 1 further comprising the steps of:

removing the insulating film after the first ion doping and before the annealing step;

forming a gate insulating film over the semiconductor film;

forming a gate electrode over the gate insulating film; and forming a channel region in the doped region of the semiconductor film by introducing a second dopant impurity into the semiconductor film by a second ion doping by using the gate electrode as a mask, wherein the semiconductor device has a thin film transistor, wherein the first dopant impurity is introduced into at least a portion of the semiconductor film, and wherein the portion constitutes the channel region of the thin film transistor.

* * * * *